United States Patent

Easoz et al.

[19]

[11] Patent Number: 6,093,244
[45] Date of Patent: Jul. 25, 2000

[54] SILICON RIBBON GROWTH DENDRITE THICKNESS CONTROL SYSTEM

[75] Inventors: John R. Easoz, McMurray; Barry Munshower, White Oak, both of Pa.

[73] Assignee: Ebara Solar, Inc., Large, Pa.

[21] Appl. No.: 08/838,600

[22] Filed: Apr. 10, 1997

Related U.S. Application Data

[60] Provisional application No. 60/015,150, Apr. 10, 1996.

[51] Int. Cl.[7] .................................................. C30B 15/26
[52] U.S. Cl. .............................. 117/15; 117/14; 117/201; 117/203; 117/211; 117/932
[58] Field of Search .............................. 117/932, 15, 201, 117/211, 203, 14

[56] References Cited

U.S. PATENT DOCUMENTS

| | | | |
|---|---|---|---|
| 4,185,076 | 1/1980 | Hatch | 422/246 |
| 4,217,165 | 8/1980 | Ciszek | 156/601 |
| 4,751,059 | 6/1988 | McHugh et al. | 422/249 |
| 4,971,650 | 11/1990 | Spitznagel et al. | 156/620.1 |
| 5,164,039 | 11/1992 | Kawashima | 117/932 |
| 5,183,528 | 2/1993 | Baba | 117/15 |
| 5,288,363 | 2/1994 | Araki | 117/932 |

FOREIGN PATENT DOCUMENTS

| | | |
|---|---|---|
| 0 444 628 | 9/1991 | European Pat. Off. . |
| 2 198 965 | 6/1988 | United Kingdom . |

OTHER PUBLICATIONS

E.M. Sachs and T. Surek, "Dynamics and Control of Meniscus Height in Ribbon Growth by the EFG Method", Journal of Crystal Growth, vol. 50, No. 1, Sep. 1980, pp. 114–125.
"Dendritic Web Growth of Silicon". Silicon Chemical Etching Raymond G. Seidensticker. 1982 (pp. 146–171).

*Primary Examiner*—Robert Kunemund
*Attorney, Agent, or Firm*—Graham & James LLP

[57] ABSTRACT

A method and system for controlling the thickness of a pair of dendrites in a dendritic silicon web growth process to improve dendritic silicon web production. An image of each dendrite in a web emerging from a silicon melt in a furnace is produced by a pair of cameras focused on the dendrite pair. The dendrite images are digitized, the average thickness of the dendrites is calculated, and compared to set point parameters. The average difference between the dendrite thicknesses and the set point parameters is used to control the overall furnace temperature, while the differences between the thickness of each pair are used to control the lateral temperature distribution in the furnace in order to maintain the dendrite thickness within predetermined limits. The method can be used in a closed loop configuration to automatically control the furnace temperature and lateral temperature distribution; or in an open loop configuration to provide visible feedback information to an operator who manually adjusts the furnace temperature conditions.

10 Claims, 2 Drawing Sheets

SILICON RIBBON GROWTH DENDRITE THICKNESS CONTROL SYSTEM

CROSS-REFERENCE TO PROVISIONAL APPLICATION

Applicants hereby claim the benefit under 35 U.S.C. Section 119(e) of U.S. Provisional application Ser. No. 60/015,150 filed Apr. 10,1996.

BACKGROUND OF THE INVENTION

This invention relates to silicon web growth technology. Dendritic web silicon substrates are produced for solar cell manufacturing, by growing thin ribbons of single crystal material from liquid silicon. The ribbon produced typically appears as a thin (100 microns) single crystal structure approximately 5 cm wide, bounded at each vertical edge by a single silicon dendrite with a thickness of approximately 700 microns. In the growth process, the center section is actually a liquid surface tension film supported by the two dendrites which have begun to solidify beneath the surface of the undercooled melt. As the crystal is pulled from the melt surface, the liquid film freezes in a stable, smooth, single crystal state. The process is described in more detail in U.S. Pat. No. 4,389,377 and Seidensticker, Journal of Crystal Growth, 39, 1977, the disclosures of which are hereby incorporated by reference.

Control of temperature and temperature distribution is absolutely critical in this process, requiring stability on the order of 0.1 C. at an absolute temperature of 1410 C. The thicknesses of the edge dendrites are extremely sensitive to temperature, and provide a convenient method of controlling temperature at the crystal based on the size of these dendrites. If the melt temperature is too low, the web degenerates from a single crystal state; if the melt temperature is too high, the crystal pulls away from the melt due to insufficient dendrite growth beneath the melt. Each of these conditions is sufficient reason to terminate the growth of an individual crystal. The throughput of the process and hence the prospect for achieving a low cost process is extremely dependent on average crystal length.

The existing art involves controlling the melt temperature through the use of a pyrometer based temperature controller which controls a single point in the hot zone. An operator adjusts the setpoint of the loop by observing the dendrite thickness of the growing crystal. In addition, the operator adjusts the lateral temperature symmetry of the melt by moving an induction coil relative to the hot zone. The operator makes the adjustments based on the visually perceived difference in the thickness of each of the two edge dendrites. The operator must continually look through a quartz window at a dendrite which is located approximately 50 cm away and make a visual estimate of dendrite edges which are only 0.7 mm thick. The range of thickness control necessary to maintain continuous growth is about +/−0.2 mm. This manual control method is extremely subjective, being based on the operator's vision, and requires a substantial investment of the operator's time, continually observing the crystal.

SUMMARY OF THE INVENTION

The invention comprises a method and system for automatically sensing and measuring the dendrites, and controlling the dendrite thickness, thereby keeping temperature under control during the dendritic web manufacturing process. The average melt temperature is controlled by automatic adjustment of temperature based on the average dendrite thickness. Temperature symmetry is achieved by feedback of dendrite thickness differences to a stepper motor which moves the induction coil relative to the hot zone.

An image of each dendrite emerging from a silicon melt in a dendritic silicon web growth furnace is generated and supplied to a thickness calculation unit. The images are preferably multiplexed so that alternate images of the dendrite pair are supplied to the thickness calculation unit. The thickness of each dendrite is calculated by digitizing each dendrite image, detecting the dendrite edges for each dendrite image, and calculating the thickness from the dendrite edge information. Preferably, a plurality of dendrite thickness calculations is averaged.

The results of the calculation step can be used in a open loop mode by displaying the results to an operator for use in manually adjusting the overall furnace temperature and the lateral furnace temperature distribution. The results can also be used in a closed loop mode by generating a thickness feedback signal, and supplying the thickness feedback signal to a first control loop for monitoring overall furnace temperature; and by generating a thickness difference signal representative of the difference in thickness between the pair of dendrites and using the thickness differential signal to control a lateral furnace temperature distribution adjustment mechanism.

When operated in the closed loop mode, the invention provides a control system that automatically controls melt temperatures in a web crystal growth furnace by using the edges of the crystal as a sensor. This control system provides a significant reduction in labor for the crystal growth process, and increases furnace throughput through the reduction of crystal termination events; thereby increasing average crystal length. When the control system is operated in the open loop mode, the invention provides information to the operator which enables more precise manual feedback to control the crystal edge thickness.

For a fuller understanding of the nature and advantages of the invention, reference should be had to the ensuing detailed description taken in conjunction with the accompanying drawings.

DETAILED DESCRIPTION OF THE PREFERRED EMBODIMENT

Figure 1:
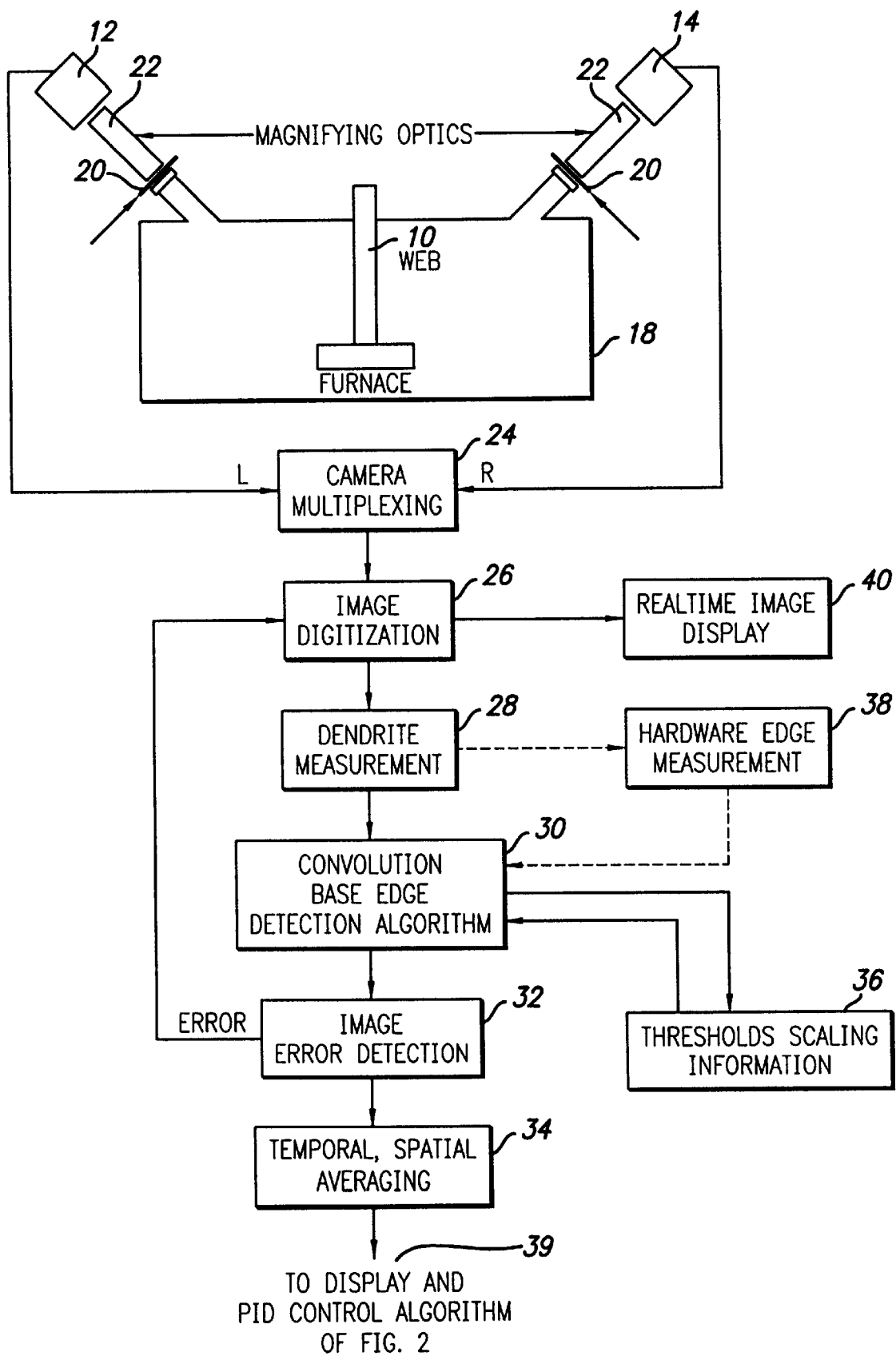
FIG. 1 is a schematic block diagram showing the main functional components of the dendrite control system.

With reference to FIG. 1, the dendrite thickness control system includes two CCTV cameras 12, 14 which are mounted on the exterior of a conventional furnace shell 18 in a fixed alignment. Each camera is aimed at a different one of the two edge dendrites of web 10, receiving the image through a reflection from a beam splitter mirror 20 which allows simultaneous observation of the dendrites by an operator who looks through the mirror. The cameras 12, 14 are fitted with an optical lens system 22 which provides a magnification of about 10× when focused at an image distance typical of the location of the dendrites as they emerge from the melt contained in the furnace. The camera images are multiplexed via a multiplexer unit 24, and coupled to an image digitization unit 26. In the preferred embodiment, the images from the left and right cameras are digitized and stored in unit 26 on an alternating basis. Each image appears solid black against a white background of the silicon melt. The dendrite images are displayed by a conventional real time video image display unit 40.

In the preferred embodiment, the software accesses three lines of pixel data across the dendrite image and executes a standard 3×3 edge detection convolution on the image in order to detect the outer edges of the magnified dendrite as indicated by a block 30. With a pixel array of 512 by 512, a single pixel represents about 25 microns of dendrite thickness. The pixel separation of the two edges is calculated, averaged in block 34 over five consecutive measurements to smooth the resulting data, and converted to a physical measurement of edge thickness of each dendrite in microns. A fixed calibration in pixels per micron is provided in the software for this last conversion by means of a block 36 of predetermined threshold and scaling information. A calibration is generated for each camera on each furnace by running the measurement system in the open loop mode and comparing resultant data with actual micrometer measurements (signified by hardware edge measurement block 38) of dendrites on a grown web.

This system can be used in both an open loop mode and a closed loop mode. In the open loop mode, the system provides continuous data to the operator by means of display unit 39, so that the operator can make appropriate manual adjustments to overall temperature and lateral temperature distribution based on the dendrite thickness information provided by the FIG. 1 system. In the closed loop mode, the measurements from the two dendrites are used in two ways.

Figure 2:
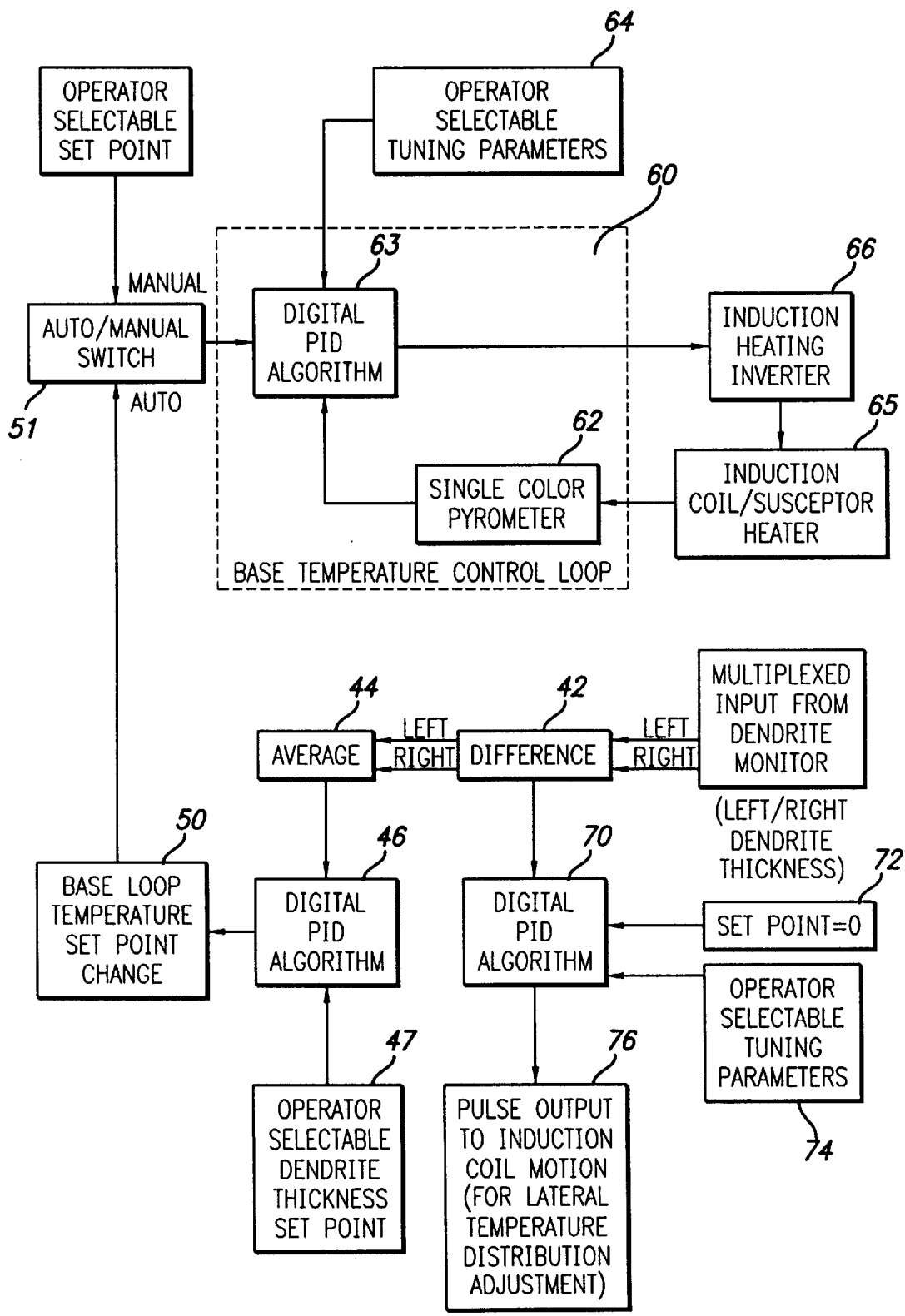
FIG. 2 is a schematic block diagram showing control logic for the system of FIG. 1.

As illustrated in FIG. 2, in the closed loop mode the average thickness of both left and right dendrites is first determined in functional blocks 42, 44 and sent to a digital proportional-integral-derivative (PID) control block 46 in real time. The PID block 46 outputs a signal which modifies the set point of the base loop temperature in block 50. The modified setpoint from block 50 is supplied to a switch 51 having a manual mode position and an automatic mode position. When operating in the closed loop mode, switch 51 is in the auto position in which the base loop temperature setpoint change from block 50 is coupled to a base temperature control loop 60. Control loop 60 includes a single color pyrometer 62 which provides a feedback signal representative of average system temperature to a digital PID algorithm block 63. Operator selectable tuning parameters are furnished from a reference block 64 as system parameter inputs to block 63. Block 63 is used to control an induction coil/susceptor heating unit via an induction heating inverter 66. In general, base control loop 60 uses the calculated base loop temperature setpoint and the actual measured overall furnace temperature (as measured by pyrometer 62) to control the average furnace temperature. This cascaded control loop allows continuous control of average system temperature based on the thickness of the dendrites.

A second PID loop comprising blocks 70, 72, 74 and 76 functions by accepting the difference in thickness between the two dendrites as an input, and generating an output signal which controls the lateral position of the induction coil in the furnace. The coil is driven by a stepper motor which accepts direction and number of steps information directly from this block 76. By adjusting the lateral location of the coil in this way, the temperature distribution across the crystal from dendrite to dendrite is controlled. As suggested by block 72, this loop always has a setpoint of zero deviation between the dendrites in order to maintain symmetry of the growing crystal.

This invention has been prototyped and demonstrated to work effectively, with a measurement resolution of up to 10 microns, and control of dendrites to within +/−50 microns. Early results on over 50 crystals have demonstrated a 40% increase in average crystal length over a process in which the invention was not used.

The invention enables longer average silicon ribbon lengths to be obtained by eliminating a common source of crystal terminations: viz. inadequately controlled temperature and temperature distributions. The longer the average silicon ribbon length, the closer the process approaches the optimum goal of continuous ribbon growth. Continuous silicon growth provides substantial throughput increases and decreases nonproductive furnace time. Also, the operator involvement is decreased with this invention, essentially lowering the labor cost per crystal and substantially reducing subjective errors in the ribbon manufacturing process.

While the above provides a full and complete disclosure of the preferred embodiments of the invention, various modifications, alternate constructions and equivalents will occur to those skilled in the art. Therefore, the above should not be construed as limiting the invention, which is defined by the appended claims.

What is claimed is:

1. A method of controlling the temperature of a silicon melt in furnace used to produce a dendritic silicon web having a pair of dendrites at opposing web edges, said method comprising the steps of:
   (a) generating an image of each dendrite emerging from a silicon melt in a dendritic silicon web growth furnace;
   (b) calculating the thickness of each dendrite; and
   (c) using the calculated thickness to adjust the furnace temperature to maintain the dendrite thickness within a predetermined range.

2. The method of claim 1 wherein said step (a) of generating includes the steps of producing an image of each dendrite and multiplexing the dendrite images to provide alternate images of the dendrite pair.

3. The method of claim 1 wherein said step (b) of calculating includes the steps of digitizing each dendrite image, detecting the dendrite edges in each dendrite image, and calculating the thickness from the dendrite edge information.

4. The method of claim 1 wherein said step (b) of calculating includes the step of averaging a plurality of dendrite thickness calculations.

5. The method of claim 1 wherein said step (c) of using includes the step of displaying the results of said step (b) of calculating to an operator for use in manually adjusting the furnace temperature.

6. The method of claim 1 wherein said step (c) of using includes the step of supplying a thickness feedback signal to a control loop for maintaining furnace temperature.

7. The method of claim 1 wherein said step (c) of using includes the step of generating an average thickness feedback signal from the difference between successive dendrite pair thicknesses, and supplying the average thickness feedback signal to a control loop for maintaining furnace temperature.

8. The method of claim 7 further including the step as providing a dendrite thickness set point and comparing the dendrite thickness set point with the average thickness feedback signal.

9. The method of claim 1 wherein said step (c) of using includes the step of generating a thickness differential signal representative of the difference in thickness between the pair of dendrites, and using the thickness differential signal to control a lateral furnace temperature distribution adjustment mechanism.

10. The method of claim 9 further including the step of providing a thickness difference set point signal, and comparing the thickness difference set point signal with the thickness differential signal.

* * * * *